United States Patent
Tokunaga

Patent Number: 6,054,741
Date of Patent: *Apr. 25, 2000

[54] SUBSTRATE AND ISULATION/MASKING STRUCTURE FOR A SEMICONDUCTOR DEVICE

[75] Inventor: Masaya Tokunaga, Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/638,895

[22] Filed: Apr. 24, 1996

[30] Foreign Application Priority Data

Apr. 25, 1995 [JP] Japan .................................. 7-100993

[51] Int. Cl.⁷ .......................... H01L 29/76; H01L 29/94; H01L 31/062; H01L 31/113
[52] U.S. Cl. ........................ 257/371; 257/370; 257/378; 257/372; 257/374
[58] Field of Search .................................. 257/370, 371, 257/374, 273, 378

[56] References Cited

U.S. PATENT DOCUMENTS

| 4,939,099 | 7/1990 | Seacrist et al. ........................ 437/31 |
| 4,949,154 | 8/1990 | Haken ..................................... 257/311 |
| 5,041,895 | 8/1991 | Contiero et al. ...................... 257/374 |
| 5,119,162 | 6/1992 | Todd et al. ............................ 257/355 |
| 5,286,986 | 2/1994 | Kihara et al. ........................ 257/370 |
| 5,286,991 | 2/1994 | Hui et al. ............................. 257/370 |
| 5,406,512 | 4/1995 | Kagenishi ............................ 257/296 |
| 5,481,126 | 1/1996 | Subramanian et al. ............. 257/273 |
| 5,567,963 | 10/1996 | Rao ...................................... 257/296 |
| 5,602,576 | 2/1997 | Murooka et al. .................... 257/370 |

Primary Examiner—Mahshid D. Saadat
Assistant Examiner—Jesse A. Fenty
Attorney, Agent, or Firm—Merchant & Gould P.C.

[57] ABSTRACT

An oxidation layer 44 for masking is formed on a PNP type transistor formation region 46a together with a field oxidation layer 42 for device separation. The oxidation layer 44 for masking is formed so as to cover an upper part of an active base formation region 52a located between the emitter/collector formation region 50a. The upper part of the active base formation region 52a which is not possible to adjust impurity concentration at processes carried out later is covered with the oxidation layer 44 for masking being formed relatively thick when boron B is implanted into a PMOS type transistor formation region 48a as channel ion. So that, boron is not implanted ionically to the active base formation region 52a. Therefore, it is not necessary to carry out masking process using photo resist layer in prior to boron implantation process.

5 Claims, 9 Drawing Sheets

SUBSTRATE AND ISULATION/MASKING STRUCTURE FOR A SEMICONDUCTOR DEVICE

BACKGROUND OF INVENTION

1. Field of the Invention

This invention relates to a semiconductor device and, more specifically, to the presence of an insulation layer which later functions to mask when impurities are implanted to the semiconductor device.

2. Description of the Prior Art

Recently, Bi-CMOS type ICs which include both a bipolar type transistor and a CMOS type transistor formed on one chip are available on the market. FIG. 1 shows a sectional side elevation of the Bi-CMOS type IC 2.

As shown in FIG. 1, in the Bi-CMOS type IC 2, a PNP type transistor 4 which is a part of the bipolar type transistor and a PMOS type transistor 6 which is a part of the CMOS type transistor are formed with a field oxide layer between.

In a conventional method for manufacturing the Bi-CMOS type IC 2, at first, a buried layer 12, an epitaxial layer 14, an oxide layer 16 and the field oxide layer 8 are formed on a positive type semiconductor substrate 10 in the order as shown in FIG. 2. Secondly, a gate electrode 18, an emitter/collector 20, a source/drain region 22 and a metal electrode 24 are formed consecutively as shown in FIG. 1.

By forming these parts in the above order, it is possible to form both the bipolar type transistor and the CMOS type transistor on one chip.

However, the conventional method for manufacturing the Bi-CMOS type IC 2 described above has the following problems to resolve. It is necessary to carry out implantation of boron B into a device formation region 6a of the PMOS type transistor 6 as a channel ion to adjust a threshold value of the PMOS type transistor 6, after forming the field oxide layer 8 and before forming the gate electrode 18 (see FIG. 1) as shown in FIG. 2.

Since the device formation region 6a of the PMOS type transistor 6 is the only part requiring implantation of boron B, other regions except the device formation region 6a are masked with a photo resist layer 26. Therefore, there is a limitation that the masking process for forming the photo resist layer 26 must be carried out after forming the field oxide layer 8 and before carrying out implantation of boron B as a channel ion.

Meanwhile, the impurity concentration for other regions excluding an active base formation region 4a formed between the emitter/collector 20 of the PNP type transistor 4 is adjustable for processes carried out later even when boron B is implanted into other regions. Therefore, it is not necessary to mask the regions for implantation of boron B except for the active base formation region 4a.

However, adjustment of the impurity concentration is not possible to conduct during processes carried out later. On the other hand, there are some problems with the processes to be carried out later when boron B is implanted to the active base formation region 4a.

Consequently, it is necessary to carry out the masking process which forms the photo resist layer 26 to prevent the active base formation region 4a from implantation of boron B, even though the area of the active base formation region 4a is relatively small.

Further, since the Bi-CMOS type IS 2 includes both of the bipolar transistor and the CMOS type transistor, when adjustment of operation characteristics for the Bi-CMOS type IC 2 is carried out by implanting impurities to the CMOS type transistor, the bipolar transistor must be masked. Alternatively, the CMOS type transistor must be masked when implantation of boron is carried out to the bipolar type transistor. Therefore, a great number of masking processes must be carried out during the manufacturing processes for the Bi-CMOS IC 2. It becomes a problem to carry out such masking processes.

OBJECT AND SUMMARY OF THE INVENTION

The purpose of the present invention is to provide a semiconductor device and a manufacturing method wherein it is possible to dope impurities without carrying out a process exclusively for masking, and improving the manufacturing method of conventional semiconductor devices such as the Bi-CMOS type IC 2 described in the above.

In accordance with characteristics of the present invention, a semiconductor device having a substrate comprises: an insulation layer required region for requiring the existence of a first insulation layer and being formed on said substrate, an impurity doping required region for requiring doping of impurities, and being formed on said substrate, an impurity doping forbidden region for forbidding doping of said impurities, being neither said insulation layer required region nor said impurity doping required region, and being formed on said substrate, a second insulation layer formed on said impurity doping forbidden region, and wherein, said second insulation layer does not substantially affect the function of said semiconductor device.

Also, in accordance with characteristics of the present invention, a method for forming a semiconductor device having a substrate for a semiconductor device characterized in that it comprises the following steps: a step for forming a first insulation layer on an insulation layer required region being formed on said substrate and where requiring existence of said first insulation layer, a step for doping of impurities into an impurity doping required region being formed on said substrate and where requiring doping of impurities, said step for doping of impurities being carried out after said step for forming a first insulation layer, and wherein in said step for forming a first insulation layer, a second insulation layer which does not substantially affect the function of said semiconductor device is formed on said substrate on an impurity doping forbidden region where doping of impurities is forbidden, and where there is neither said insulation layer required region nor said impurity doping required region, and wherein said step for doping of impurities is carried out by utilizing said second insulation layer formed at said step for forming a first insulation layer as a part or whole of a mask.

While the novel features of the invention are set forth in a general fashion, both as to organization and content, it will be better understood and appreciated, along with other objections and features thereof, from the following detailed description taken in conjunction with the drawings.

DETAILED DESCRIPTION OF THE PREFERRED EMBODIMENT

Figure 3:
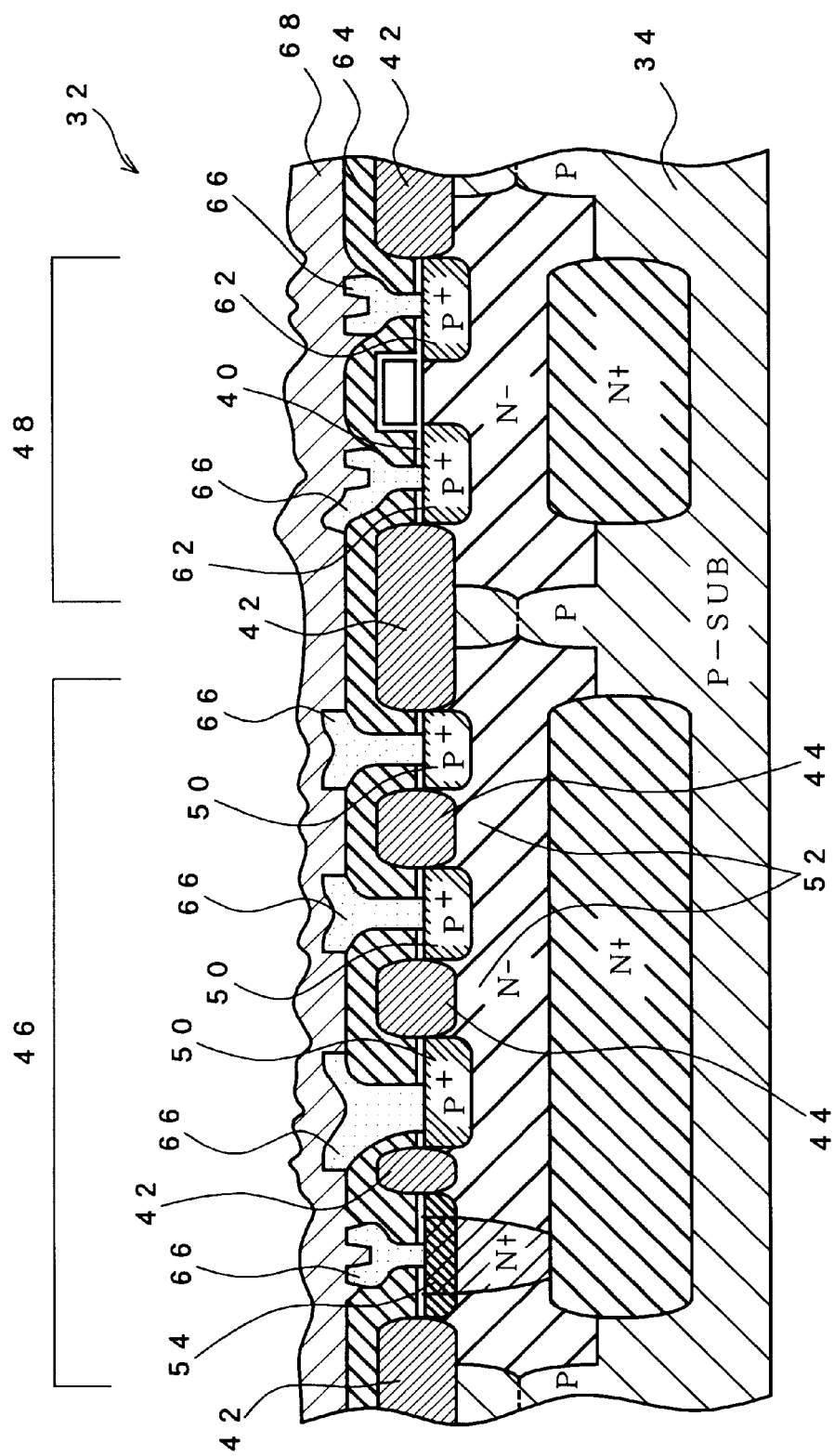
FIG. 3 is a sectional side elevation of a Bi-CMOS type IC as an embodiment of the present invention.

FIG. 3 shows a sectional side elevation of a Bi-CMOS type IC 32 as an embodiment of the present invention. On a substrate 34 for semiconductor device (hereinafter referred to as a substrate) of the Bi-CMOS type IC 32 shown in FIG. 3, a PNP type transistor 46 which is a part of a bipolar type transistor and a PMOS type transistor 48 which is a part of a CMOS type transistor are positioned with a field oxide layer 42 for device separation between.

In the PNP type transistor 46, an oxidation layer 44 for masking which acts as a field oxidation layer for forbidding boron (used as a positive type impurity) implantation is positioned so as to cover an upper part of an active base 52.

The masking oxidation layer 44 is formed together with the formation of field oxidation layer 42 for device separation, and the masking oxidation layer 44 for masking is used for masking the active base formation region 52a (see FIG. 6) when boron is implanted into a PMOS type transistor formation region 48a (see FIG. 6) which act as a device formation region of the PMOS type transistor 48.

Figure 4:
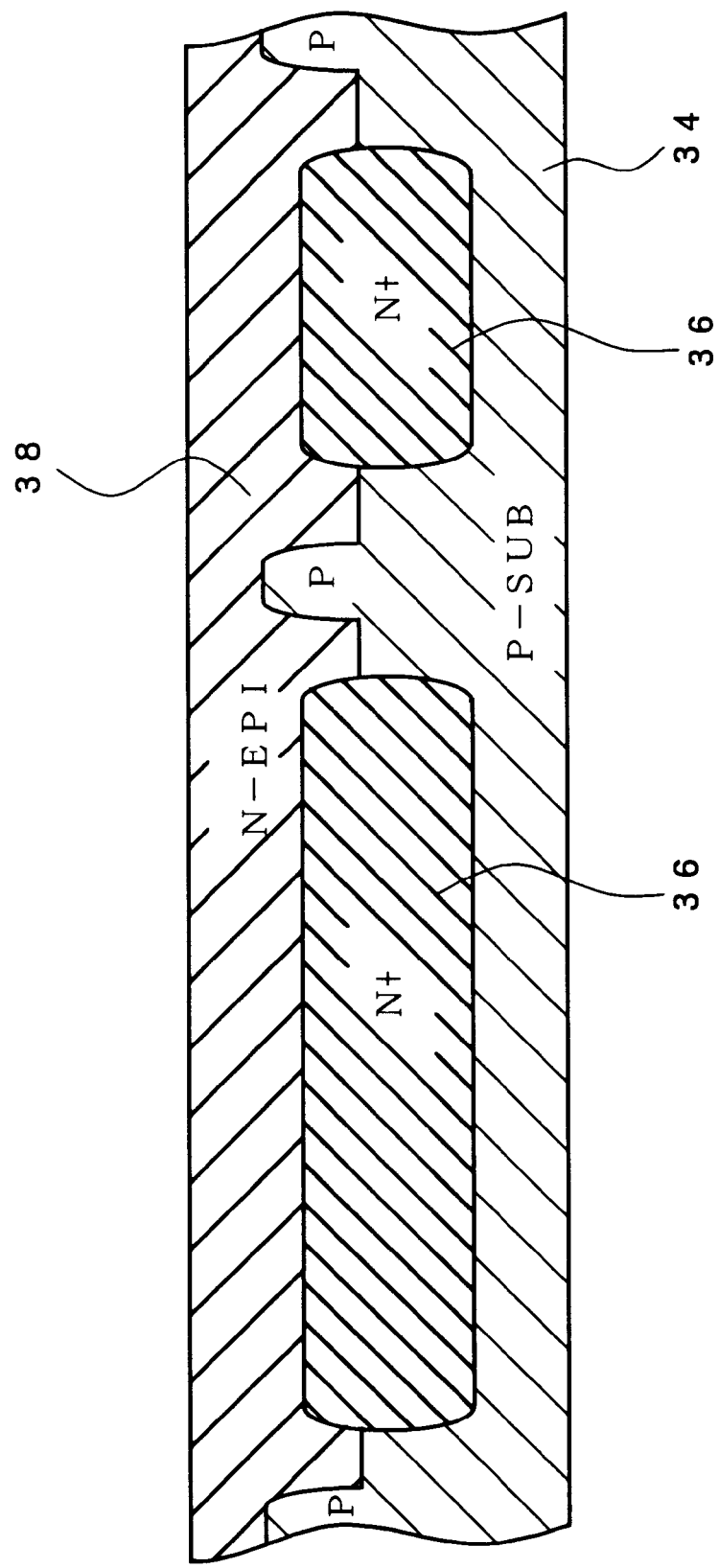
FIG. 4 shows a part of manufacturing processes of the Bi-CMOS type IC as an embodiment of the present invention.

Next, a method for manufacturing the Bi-CMOS type IC 32 will be described below based on FIG. 4 to FIG. 9 and FIG. 3. At first, a buried layer 36, an epitaxial layer 38 and other layers are formed on an substrate 34 as shown in FIG. 4. The processes for forming these layers are exactly the same as the conventional method.

Figure 5:
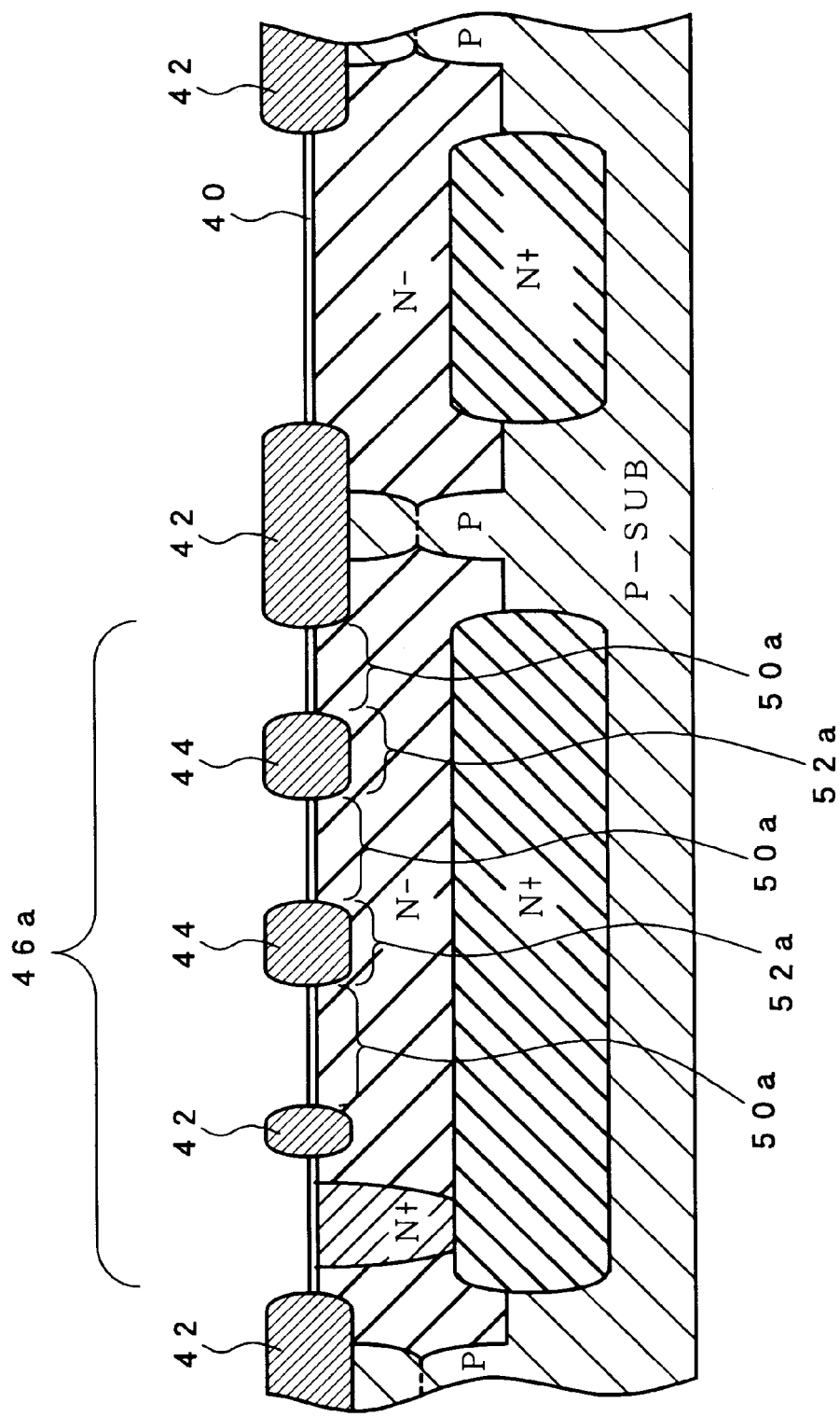
FIG. 5 shows a part of manufacturing processes of the Bi-CMOS type IC as an embodiment of the present invention.

Upon forming these layers, an oxidation layer 40 is formed on a wafer as well as forming the field oxidation layer 42 for device separation as shown in FIG. 5. A masking oxidation layer 44 for masking is formed on the PNP type transistor formation region 46a together with the field oxidation layer 42 for device separation. Also, the masking oxidation layer 44 is positioned so as to cover the upper part of the active base formation region 52a located between an emitter/collector formation region 50a. Further, both the field oxide layer 42 for device separation and the masking oxidation layer 44 are formed by utilizing so called Local oxidation of Silicon (LOCOS) method which is known to those who are skilled in the art. In this embodiment, both the field oxide layer 42 for device separation and the masking oxidation layer 44 are formed in thickness of approximately 4,000 Å respectively.

Figure 6:
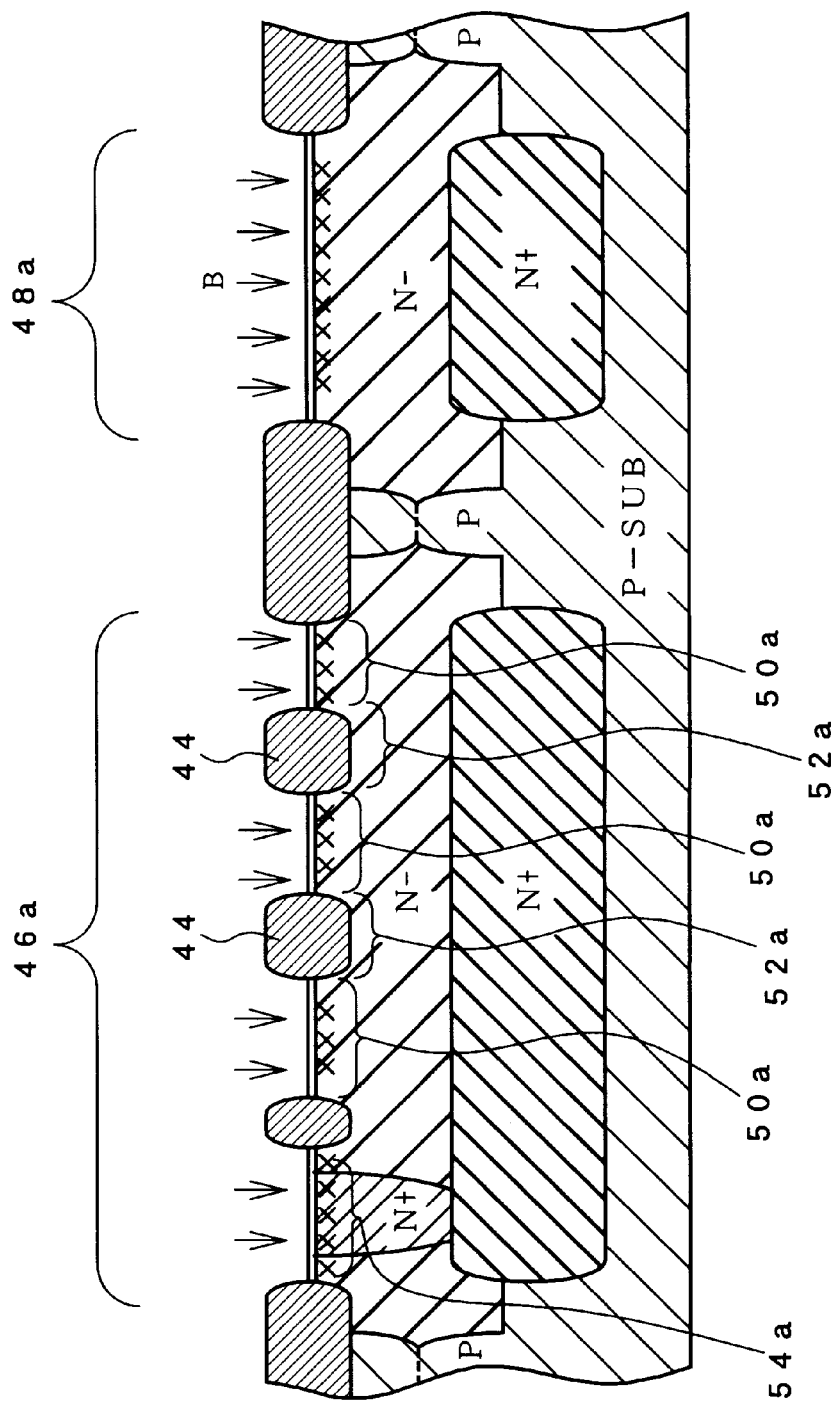
FIG. 6 shows a part of manufacturing processes of the Bi-CMOS type IC as an embodiment of the present invention.

Thereafter, boron B (used as a positive type impurity) is implanted into the PMOS type transistor formation region 48a as a channel ion for adjusting a threshold value of the PMOS type transistor 48 as shown in FIG. 6.

Since both the emitter/collector formation region 50a and an external base formation region 54a are not masked with any layers, boron B is implanted to these regions unintentionally during implantation process. It is not necessary to mask those regions at this process step because impurity concentration for those regions is adjustable during processes carried out later.

On the other hand, once the boron B is implanted to the active base formation region 52a, it is not possible to adjust the impurity concentration during processes carried out later. In this embodiment, boron is not implanted tonically into the active base formation region 52a, because the upper part of the region 52a is covered with the masking oxidation layer 44 formed relatively thick.

Figure 1:
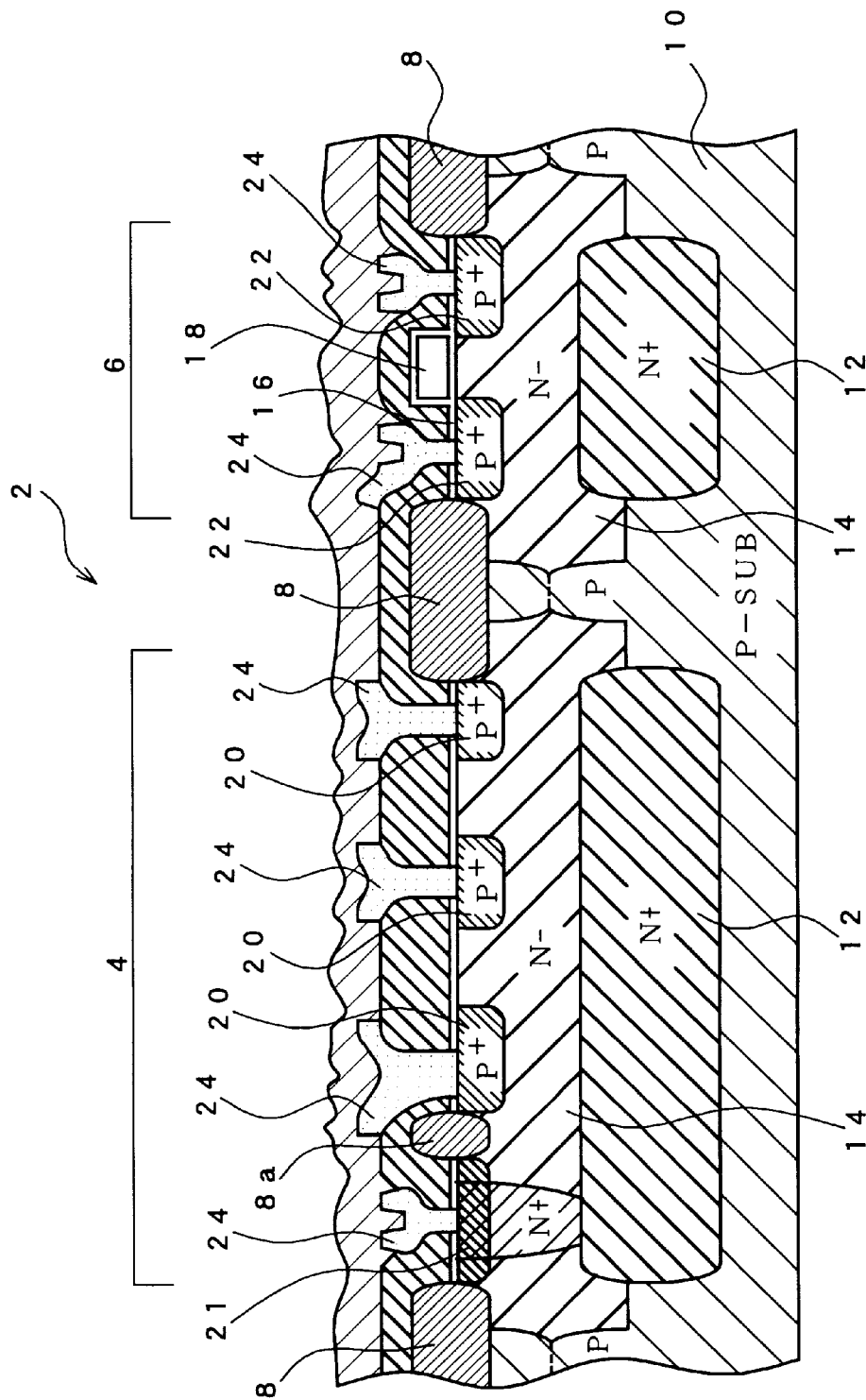
FIG. 1 is a sectional side elevation of a Bi-CMOS type IC in the prior art.
Figure 2:
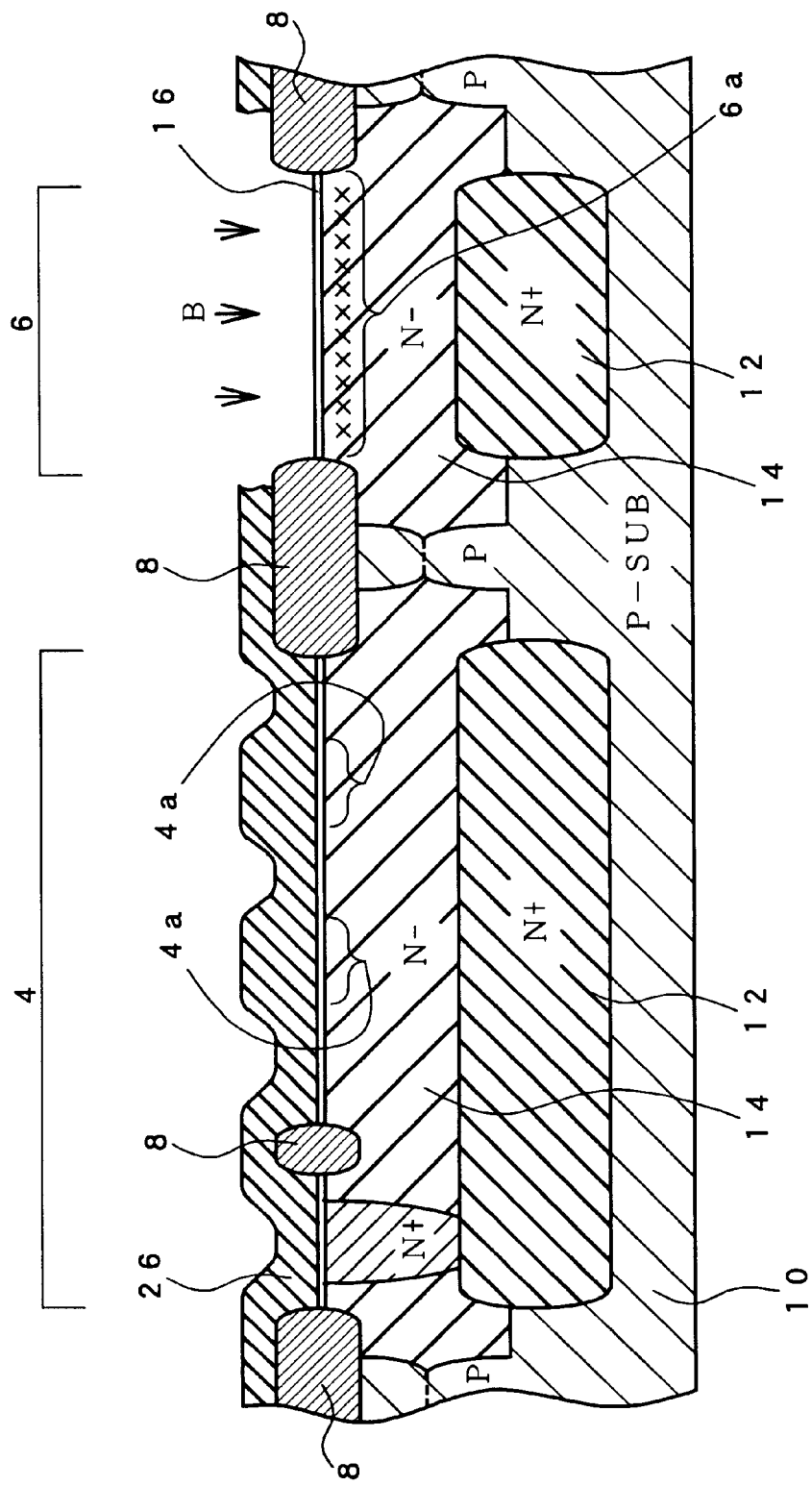
FIG. 2 shows a part of manufacturing processes of a Bi-CMOS type IC in the prior art.

Therefore, it is not necessary to carry out a masking process using a photo resist layer prior to carrying out the processes as the prior art (see FIG. 2).

Figure 7:
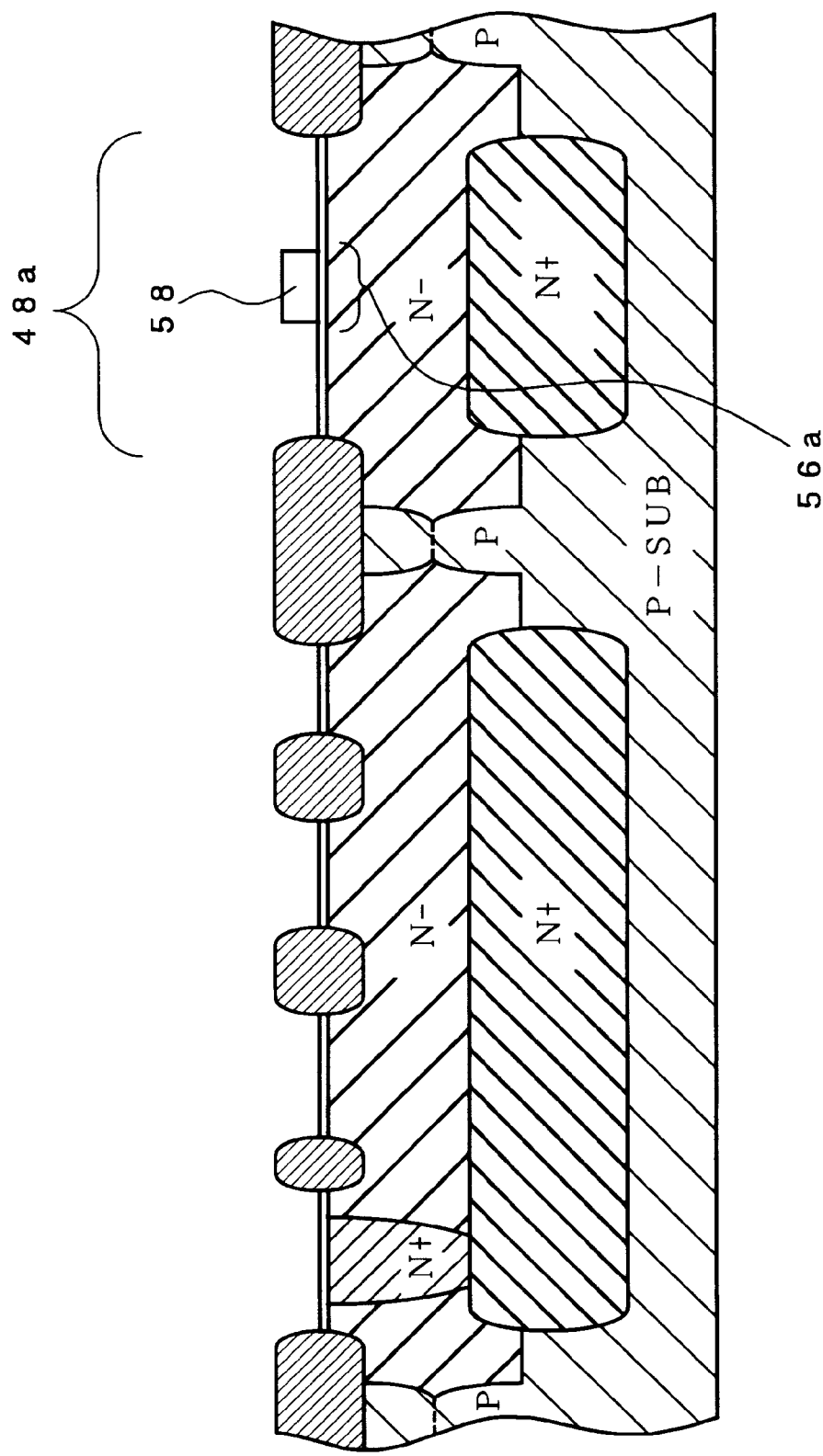
FIG. 7 shows a part of manufacturing processes of the Bi-CMOS type IC as an embodiment of the present invention.

Further, a gate electrode 58 made of polysilicon is formed on an upper part of a gate formation region 56a of the PMOS type transistor formation region 48a as shown in FIG. 7.

Figure 8:
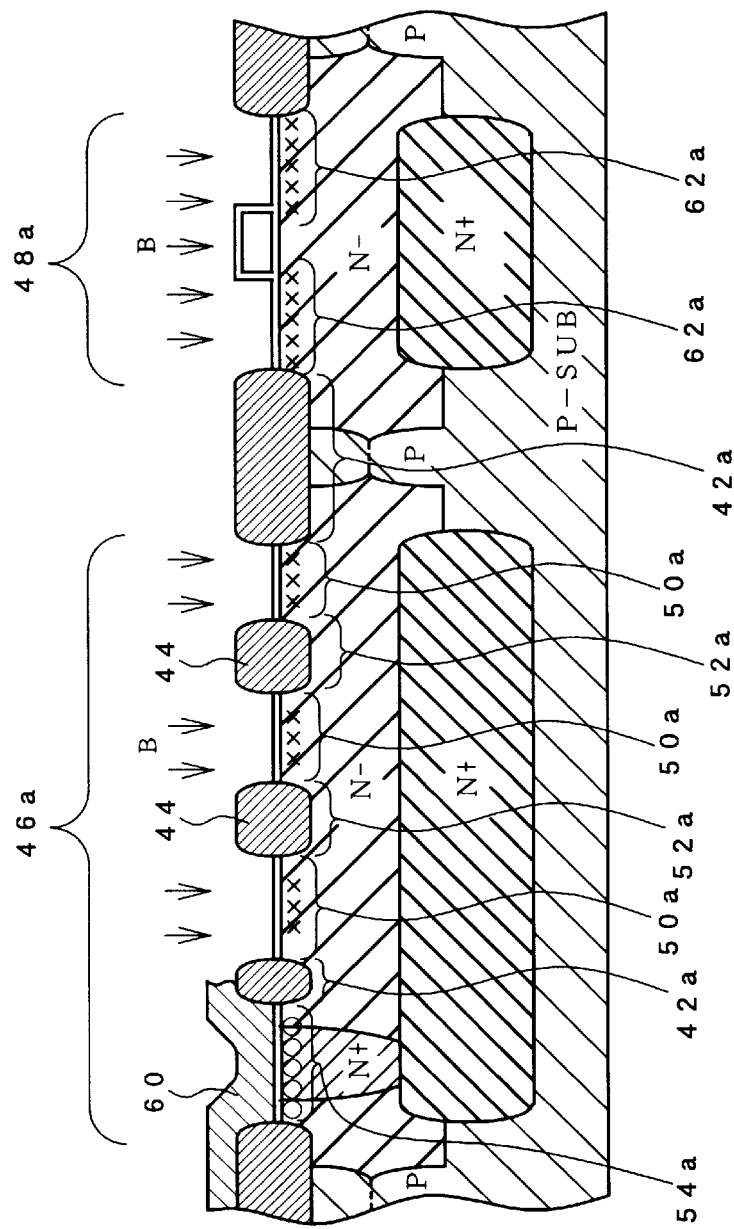
FIG. 8 shows a part of manufacturing processes of the Bi-CMOS type IC as an embodiment of the present invention.

Thereafter, a resist layer 60 is formed so as to cover the external base formation region 54a of the PNP type transistor formation region 46a, and boron B (used as a positive type impurities) is implanted tonically into the wafer using the resist layer 60 as a mask shown in FIG. 8. The reason to cover the external base formation region 54a with the resist layer 60 is to prevent further ion implantation of boron B. Since negative type impurities such as phosphor P and arsenic As (shown as "o" marks in the Figures) have already been implanted into the external base formation region 54a.

At the implantation process of boron B shown in FIG. 8, boron B (shown as "x" marks in the Figures) is implanted into both the emitter/collector formation region 50a of the PNP type transistor formation region 46a and a source/drain formation region 62a of the PMOS type transistor formation region 48a.

During the implantation process described above, the masking oxidation layer 44 used in a previous process (see FIG. 6) can also be used as a mask. In this way, it is not necessary to form the resist layer (mask) at each process. Therefore, misplacement of the mask caused by forming the resist layer each time is avoided. Consequently, misalignment between the active base formation region 52a and the emitter/collector formation region 50a does not occur.

Figure 9:
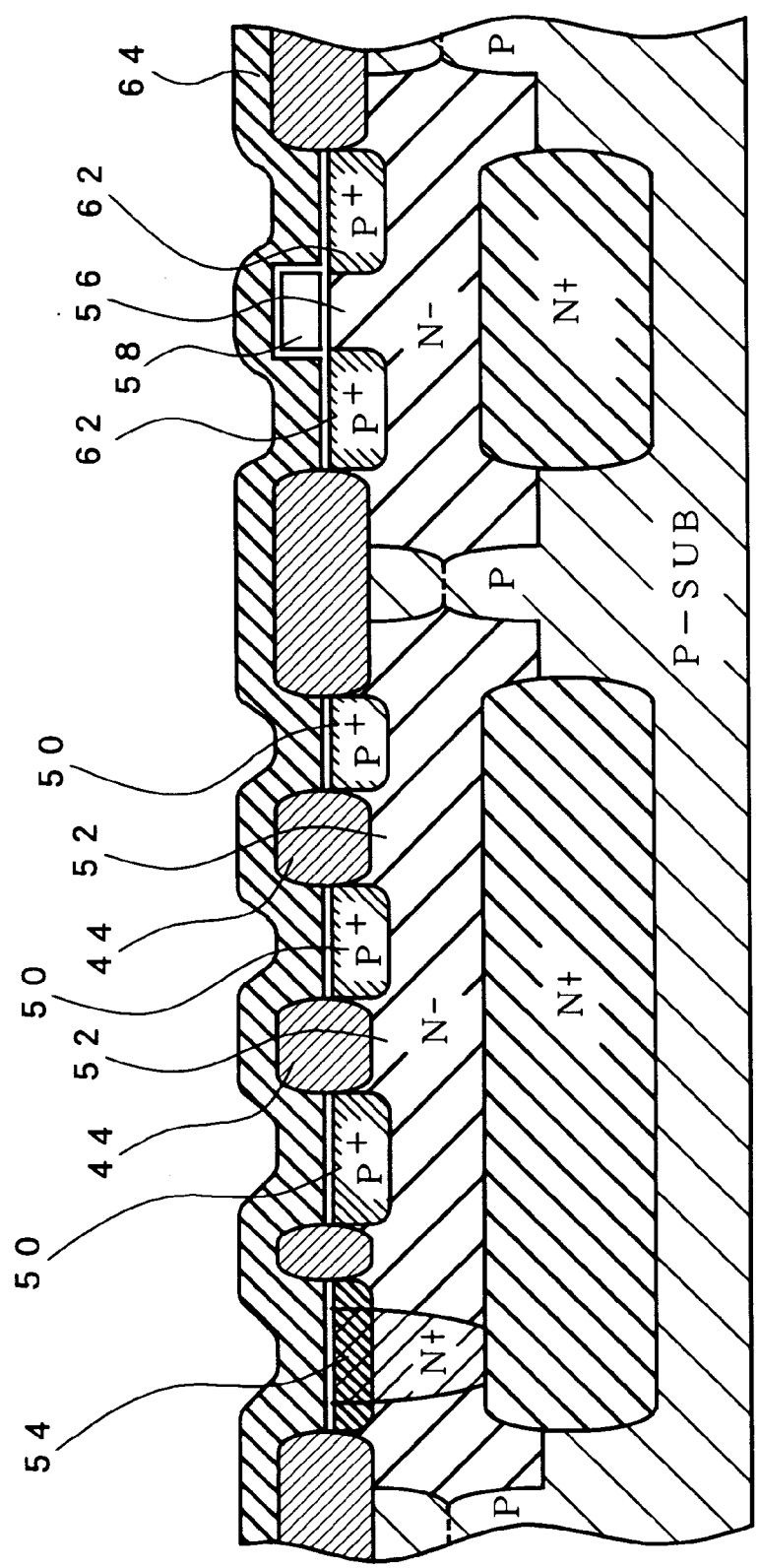
FIG. 9 shows a part of manufacturing processes of the Bi-CMOS type IC as an embodiment of the present invention.

Thereafter, an upper part of the wafer is covered with an inter layer (BPSG) as shown in FIG. 9, then heat treatment (reflow) is carried out. By carrying out heat treatment, reflow and thermal diffusion of phosphor P, arsenic As and boron implanted into various regions at the process shown in FIG. 8 and other processes (not shown) can be performed simultaneously. An external base 54, an emitter/collector 50 and a source/drain 62 are formed by performing thermal diffusion. Also, the active base formation region 52a and the gate formation region 56a, both of which are not implanted with the impurities as a result of covering each with the masking oxidation layer 44, and the gate electrode 58 (see FIG. 6 and FIG. 7) become an active base 52 and a channel formation region 56 of the gate respectively.

Further, upon making holes through the interlayer 64 and the oxidation layer 40 as shown in FIG. 3, an electrode 66 made of aluminum-silicon is formed so as to contact with the external base 54, the emitter/collector 50 and the source/ drain 62. Then, a passivation layer 68 is formed thereon. If it is necessary, another electrode made of aluminum-silicon and a passivation layer (not shown) are formed on the passivation layer 68.

Thus, the Bi-CMOS type IC 32 having both the PNP type transistor 46 and the PMOS type transistor 48 is formed. Although the masking oxidation layer 44 is positioned in between the electrode 66 as shown in FIG. 3, it does not provide any bad electrical influences on function of the Bi-CMOS type IC 32 as a result of less parasitic capacitance due to the oxidation layer being formed relatively thick.

In this embodiment, the PNP type transistor 46 and the PMOS type transistor 48 are used as an example to describe transistors which are a part of the bipolar type transistor and the CMOS type transistor respectively. It is not limited to use these transistors for both the bipolar type transistor and the CMOS type transistor, other types of transistors can be used.

For instance, an NPN type transistor or a device having similar electric characteristics can be used as a circuit element which consist of the bipolar type transistor. An NMOS type transistor, a poly-silicon resistor, a poly-silicon capacitor are included for circuit elements which can be used for the CMOS type transistor. Also, each of the bipolar type transistor and the CMOS type transistor can be formed with a plurality of circuit elements. Further, although the Bi-CMOS type transistor is used as an example of the semiconductor device in the present embodiment, it is not limited to the Bi-CMOS type transistor. Other types of semiconductor devices can be applied to the present invention.

Still further, although boron B is used as an example of the impurities in this embodiment, other impurities in both positive type such as gallium and negative type impurities such as phosphor P and arsenic As can be used in the present invention. Also, the field oxidation layer is used as a second insulation layer, other kinds of insulation layers can be used for the second insulation layer.

In this embodiment, the masking oxidation layer 44 formed during a process shown in FIG. 5 is not removed through the final process as shown in FIG. 3. It is possible to remove the masking oxidation layer 44 either when completing the channel ion implantation process for implanting boron B tonically to the PMOS type transistor formation region 48a (see FIG. 6) or after completion of boron B implantation process into both the emitter/collector formation region 50a and the source/drain formation region 62a (see FIG. 8).

The present invention is characterized in that the second insulation layer which does not substantially affect the function of the semiconductor device subject to existence of itself is formed on the impurity doping forbidden region where doping of impurities is forbidden.

It is therefore possible to form the second insulation layer on the impurity doping forbidden region simultaneous with formation of the first insulation layer on the insulation layer required region. Also, the second insulation layer thus formed does not interfere with the function of the semiconductor device. As a result of that, it is possible to use the second insulation layer as a part or whole of the mask when the impurities are doped into the impurity doping required region. In other words, the impurities can be doped without carrying out a process exclusively for masking.

Further, the present invention is characterized in that the semiconductor device is the Bi-CMOS type IC comprising two types of transistors such as the bipolar type transistor which includes the PNP type transistor and the CMOS type transistor which includes the PMOS type transistor, the field oxidation layer is formed as the first insulation layer and the second insulation layer, and the device separation region is formed as the insulation layer required region, the positive type impurities are used as the impurities, and the device formation region of the PMOS type transistor is formed as the impurity doping required region, and the active base formation region formed between the emitter formation region and the collector formation region of the PNP type transistor is formed as the impurity doping forbidden region.

It is therefore possible to form the field oxidation layer on the active base formation region formed between the emitter formation region and the collector formation region of the PNP type transistor, simultaneous with formation of the field oxidation layer on the device separation region. Also, the field oxidation layer thus formed on the active base formation region does not interfere with the function of the PNP type transistor.

Therefore, it is possible to use the field oxidation layer formed on the active base formation region as a part or whole of the mask when the positive type impurities are implanted into the device formation region as a channel ion for adjusting the threshold value of the PMOS type transistor. In other words, the channel ion can be implanted without carrying out a process exclusively for masking.

Also, the field oxidation layer thus formed on the active base formation region can be used as a part or whole of the mask when the positive type impurities are implanted into the emitter formation region and the collector formation region to form both the emitter and the collector of the PNP type transistor. Thus, misplacement among the impurity doping forbidden region, the emitter formation region and the collector formation region can never happen. Consequently, misalignment among these regions does not occur. So that, high reliability as to the PNP type transistor can be obtained.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device having a substrate comprising:

an insulation layer required region with a first field oxide layer existing thereon and being formed on said substrate, wherein the insulation layer required region is located on the substrate at locations necessary to provide electrical isolation, an impurity doping required region for requiring doping of impurities, and being formed on said substrate, an impurity doping forbidden region for forbidding doping of said impurities, being neither said insulation layer required region nor said impurity doping required region, and being formed on said substrate, wherein the impurity doping forbidden region is located on the substrate at locations necessary to cover an upper part of an active base of a bipolar type transistor, a second field oxide layer formed in common with the first field oxide layer and formed on said impurity doping forbidden region, and wherein, said second field oxide layer does not affect substantially the function of said semiconductor device.

2. A semiconductor device in accordance with claim 1, wherein said semiconductor device is a Bi-CMOS type IC comprises two types of transistors such as a bipolar type transistor which includes a PNP type transistor and a CMOS type transistor which includes a PMOS type transistor, a device separation region is formed as said insulation layer required region, positive type impurities are used as said impurities, and a device formation region of the PMOS type transistor is formed as said impurity doping required region, and an active base formation region formed between emitter formation region and a collector formation region of the PNP type transistor is formed as said impurity doping forbidden region.

3. A semiconductor device in accordance with claim 2, wherein said field oxidation layer is formed by local oxidation of silicon (LOCOS) method.

4. A semiconductor device in accordance with claim 2, wherein said field oxidation layer is formed in thickness of approximately 4,000 Å.

5. A semiconductor device in accordance with claim 2, wherein boron is used as said positive type impurities.

* * * * *